United States Patent
Lee

[19]

[11] Patent Number: 6,084,765
[45] Date of Patent: Jul. 4, 2000

[54] INTEGRATED CIRCUIT CAPACITORS HAVING RECESSED OXIDATION BARRIER SPACERS

[75] Inventor: Byoung-Taek Lee, Seoul, Rep. of Korea

[73] Assignee: Samsung Electronics Co., Ltd., Rep. of Korea

[21] Appl. No.: 09/204,596

[22] Filed: Dec. 3, 1998

[30] Foreign Application Priority Data

Dec. 6, 1997 [KR] Rep. of Korea ............. 97-66534

[51] Int. Cl.[7] ........................................ H01G 4/06
[52] U.S. Cl. .............. 361/311; 361/303; 361/301.4; 361/306.1; 257/310; 257/306
[58] Field of Search ................. 361/311, 312, 361/313, 301.1, 301.4, 303, 304, 305, 306.1, 306.3, 320, 321, 321.1–321.5; 365/145, 149; 257/295–300, 306, 310; 29/25.41–25.42; 438/250, 253, 240, 244

[56] References Cited

U.S. PATENT DOCUMENTS 5,808,854  9/1998  Figura et al. ............... 361/321.4
5,883,781  9/1998  Yamamichi et al. ......... 361/321.4

*Primary Examiner*—Hyung-Sub Sough
*Assistant Examiner*—Eric Thomas
*Attorney, Agent, or Firm*—Myers Bigel Sibley & Sajovec

[57] ABSTRACT

Integrated circuit capacitors utilize improved sidewall spacers to protect diffusion barrier layers from parasitic oxidation and capacitor electrodes from being overetched. These sidewall spacers include a composite of a material such as $Al_2O_3$ or $Ta_2O_5$ which contacts the diffusion barrier layer and another material such as silicon dioxide, silicon nitride or spin-on-glass. A preferred integrated circuit capacitor includes a semiconductor substrate, a first interlayer insulating layer having a contact hole therein, on the substrate, and a polysilicon conductive plug in the contact hole. A first capacitor electrode is also provided on the first interlayer insulating layer and extends opposite the conductive plug. To inhibit oxidation of the conductive plug and chemical reaction between the conductive plug and the first capacitor electrode, a diffusion barrier layer is provided between the first capacitor electrode and the conductive plug. The diffusion barrier layer has a sidewall which is recessed relative to a sidewall of the first capacitor electrode. To inhibit parasitic oxidation of the diffusion barrier layer, a preferred electrically insulating spacer is provided on the recessed sidewall of the diffusion barrier layer. The electrically insulating spacer includes a composite of a first spacer region having a sidewall which is substantially coplanar with a sidewall of the first capacitor electrode and a second spacer region which extends between the first spacer region and the recessed sidewall of the diffusion barrier layer.

12 Claims, 6 Drawing Sheets

INTEGRATED CIRCUIT CAPACITORS HAVING RECESSED OXIDATION BARRIER SPACERS

RELATED APPLICATION

This application is related to Korean Application No. 97-66534, filed Dec. 6, 1997, the disclosure of which is hereby incorporated herein by reference.

FIELD OF THE INVENTION

The present invention relates to integrated circuit devices and methods of forming integrated circuit devices, and more particularly to integrated circuit capacitors and methods of forming integrated circuit capacitors.

BACKGROUND OF THE INVENTION

Many state-of-the-art integrated circuits require the use of storage capacitors. For example, in dynamic random access memory (DRAM) devices, storage capacitors perform a vital data storing function. To enable DRAM and other devices become more highly integrated, techniques are required to increase the storage capacity of capacitors even as their lateral dimensions are reduced. Such techniques have included the use of capacitor dielectric materials having high dielectric strengths, such as tantalum pentoxide ($Ta_2O_5$) and oxynitride (ON), because the capacitance of a capacitor is directly proportional to the magnitude of the dielectric strength of the dielectric material therein. Because the capacitance of a capacitor is also directly proportional to the surface area of the storage electrodes therein, storage electrodes having three-dimensional structures have also been developed. Examples of such capacitors include double-stacked, finned stacked, cylindrical, spread-stacked and box structure capacitors and hemispherically-grained (HSG) capacitors. Unfortunately, such three-dimensional structures may require complex fabrication steps and may be susceptible to fabrication defects which can limit long term reliability.

Other high dielectric materials have also been considered. Such high dielectric materials include barium strontium titanate (BST), lead zinconium titanate (PZT) and lead lanthanum zinconate titanate (PLZT). These materials have dielectric strengths that are much greater than other conventional dielectric materials. Unfortunately, these high dielectric materials may chemically react with conventional electrode materials (e.g., polysilicon) and degrade the electrical characteristics of capacitors formed thereby (e.g., increase leakage current). To address these limitations, additional electrode materials have been considered for compatibility with high dielectric materials such as BST, PZT and PLZT and silicon. These electrode materials include platinum (Pt), iridium (Ir), ruthenium (Ru), and ruthenium dioxide ($RuO_2$), for example. The compatibility of these materials in lower electrodes of capacitors may be somewhat limited, however, because these materials may be susceptible to parasitic oxygen diffusion and such parasitic diffusion may degrade the electrical characteristics of regions adjacent these materials. To address these limitations, barrier layers have been considered as intermediate layers to be used between these electrode materials and surrounding capacitor regions (e.g., polysilicon conductive plugs). Nonetheless, oxidation of barrier layers can degrade the electrical characteristics of capacitors even if the barrier layers provide sufficient protection against oxygen diffusion.

Accordingly, techniques have also been considered which reduce the likelihood that such barrier layers will become oxidized in high dielectric capacitors. To illustrate, FIG. 1 provides a cross-sectional view of a conventional high dielectric integrated circuit capacitor. This capacitor comprises a semiconductor substrate 1 and an interlayer insulating layer 2 on the substrate 1. Conductive contact plugs 4 are also formed in the interlayer insulating layer 2 and these plugs 4 contact the semiconductor substrate 1. Each capacitor also includes a lower capacitor electrode 8, a high dielectric material 14 on the lower electrode 8 and an upper capacitor electrode 16 on the high dielectric material 14. A diffusion barrier layer 6 is also provided between the lower capacitor electrode 8 and the conductive contact plug 4. In addition, sidewall insulating spacers 9 are provided in recesses between the diffusion barrier layer 6 and the high dielectric material 14.

A conventional method of forming the integrated circuit capacitor of FIG. 1 is illustrated by FIGS. 2A–2B. In particular, FIG. 2A illustrates a structure having a diffusion barrier layer 6 and a lower capacitor electrode 8 on the diffusion barrier layer 6. As illustrated, the diffusion barrier layer 6 has been etched back so that its sidewalls are recessed relative to the sidewalls of the lower capacitor electrode 8. An oxidation barrier material 10 has also been deposited on the lower capacitor electrode 8 and this oxidation barrier material 10 fills the recesses between the sidewalls of the lower capacitor electrode 8 and the corresponding diffusion barrier layer 6. This oxidation barrier material 10 may comprise a material such as silicon nitride (SiN) or high density silicon dioxide ($HD-SiO_2$).

In order to obtain good step coverage to completely fill the recesses, the oxidation barrier material 10 should be deposited at a relatively high temperature. However, such high temperature deposition can increase the rate of oxidation of the diffusion barrier layer 6. Deposition at a lower temperature can be used to reduce the likelihood of parasitic oxidation, however, such low temperature deposition may reduce the degree of step coverage and prevent the recesses from being completely filled. To address this problem, materials such as spin-on-glass (SOG) or flowable oxide (FOX) have been considered because they provide good step coverage even when deposited at low temperatures. But, as illustrated by FIG. 2B, removal of such oxidation barrier materials 10 using an etching technique may also result in a removal of some of the material comprising the lower electrode 8. If this occurs, the remaining oxidation barrier material may have an irregular pillar structure 11 at the end of etching and the thickness of the resulting sidewall spacers 10a may be nonuniform. Both of these defects can lead to a degradation in the reliability and performance characteristics of the capacitors.

Referring now to FIGS. 3A–3B, another conventional method of forming integrated circuit capacitors is illustrated. This method is similar to the method of FIGS. 2A–2B, however, an aluminum oxide ($Al_2O_3$) material is used as the oxidation barrier layer 12 because it has good step coverage even when deposited at low temperatures. Unfortunately, as illustrated by FIG. 3B, because aluminum oxide may have poor etching selectivity relative to many of the materials used to form the lower capacitor electrode 8, the resulting lower capacitor electrode 8a may have significantly reduced surface area after the oxidation barrier layer 12 has been etched-back. In addition, the remaining sidewall spacers 12a may have large lateral dimensions which may limit integration density.

Thus, notwithstanding these above-described methods of forming integrated circuit capacitors, there still continues to be a need for improved integrated circuit capacitors and methods of forming same.

SUMMARY OF THE INVENTION

It is therefore an object of the present invention to provide improved integrated circuit capacitors and methods of forming same.

It is a further object of the present invention to provide integrated circuit capacitors having improved diffusion barrier layers therein and methods of forming same.

It is still a further object of the present invention to provide integrated circuit capacitors having diffusion barrier layers therein which can be less susceptible to parasitic oxidation and methods of forming same.

These and other objects, advantages and features of the present invention are provided by integrated circuit capacitors which utilize improved sidewall spacers to protect diffusion barrier layers from parasitic oxidation. These sidewall spacers preferably comprise a composite of a material such as $Al_2O_3$ or $Ta_2O_5$ which contacts the diffusion barrier layer and another material such as silicon dioxide, silicon nitride or spin-on-glass, for example.

In particular, a preferred integrated circuit capacitor comprises a semiconductor substrate, a first interlayer insulating layer having a contact hole therein, on the substrate, and a polysilicon conductive plug in the contact hole. A first capacitor electrode is also provided on the first interlayer insulating layer and extends opposite the conductive plug. To inhibit oxidation of the conductive plug and chemical reaction between the conductive plug and the first capacitor electrode, a diffusion barrier layer is provided between the first capacitor electrode and the conductive plug. The diffusion barrier layer extends adjacent an underlying surface of the first capacitor electrode and has a sidewall which is recessed relative to a sidewall of the first capacitor electrode. To inhibit parasitic oxidation of the diffusion barrier layer, a preferred electrically insulating spacer is provided on the recessed sidewall of the diffusion barrier layer.

According to a preferred aspect of the present invention, the electrically insulating spacer comprises a composite of a first spacer region having a sidewall which is substantially coplanar with a sidewall of the first capacitor electrode and a second spacer region which extends between the first spacer region and the recessed sidewall of the diffusion barrier layer. The second spacer region also contacts the underlying surface of the first capacitor electrode. Here, the first spacer region may comprise a material such as silicon dioxide, silicon nitride or spin-on-glass and the second spacer region preferably comprises a material such as $Al_2O_3$ or $Ta_2O_5$ which can be deposited at low temperatures and has good step coverage. The second spacer region is also preferably formed to a thickness in a range between about 10 Å and 500 Å.

Preferred integrated circuit capacitors also include a dielectric layer extending on an upper surface and on the sidewall of the first capacitor electrode and a second capacitor electrode extending on the dielectric layer. The dielectric layer may comprise a high dielectric material such as BST, PZT, PLZT and perovskite-type oxides. The first and second capacitor electrodes may also comprise a material selected from the group consisting of Pt, Ru, $RuO_2$, Ir, $IrO_2$ and perovskite-type conductive materials. A first interlayer insulating layer is provided on the substrate and has a contact hole therein which is filled by a conductive plug (e.g., polysilicon plug). This conductive plug may electrically contact the substrate and the diffusion barrier layer.

According to another embodiment of the present invention, methods of forming integrated circuit capacitors comprise the steps of forming a diffusion barrier layer on a substrate and forming a first capacitor electrode on the diffusion barrier layer, opposite the substrate. A step is then performed to selectively etch a sidewall of the diffusion barrier layer so that a recess is formed between the sidewall of the diffusion barrier layer and a sidewall of the first capacitor electrode. Next, a first oxidation barrier layer of a first material is formed on the sidewall of the first capacitor electrode and in the recess. A second oxidation barrier layer of a second material is also formed on the first oxidation barrier layer. Here, the second oxidation barrier layer extends opposite the sidewall of the first capacitor electrode and into the recess. A step is then performed to selectively etch the second oxidation barrier layer to define an electrically insulating spacer in the recess, using the first oxidation barrier layer as an etch-stop layer. Thus, the electrically insulating spacer comprises a composite of the first and second materials. Steps are then performed to complete a preferred capacitor by forming a dielectric layer on the first capacitor electrode and then forming a second capacitor electrode on the dielectric layer.

DESCRIPTION OF PREFERRED EMBODIMENTS

The present invention will now be described more fully hereinafter with reference to the accompanying drawings, in which preferred embodiments of the invention are shown. This invention may, however, be embodied in different forms and should not be construed as limited to the embodiments set forth herein. Rather, these embodiments are provided so that this disclosure will be thorough and complete, and will fully convey the scope of the invention to those skilled in the art. It will also be understood that when a layer is referred to as being "on" another layer or substrate, it can be directly on the other layer or substrate, or intervening layers may also be present. Like numbers refer to like elements throughout.

Figure 1:
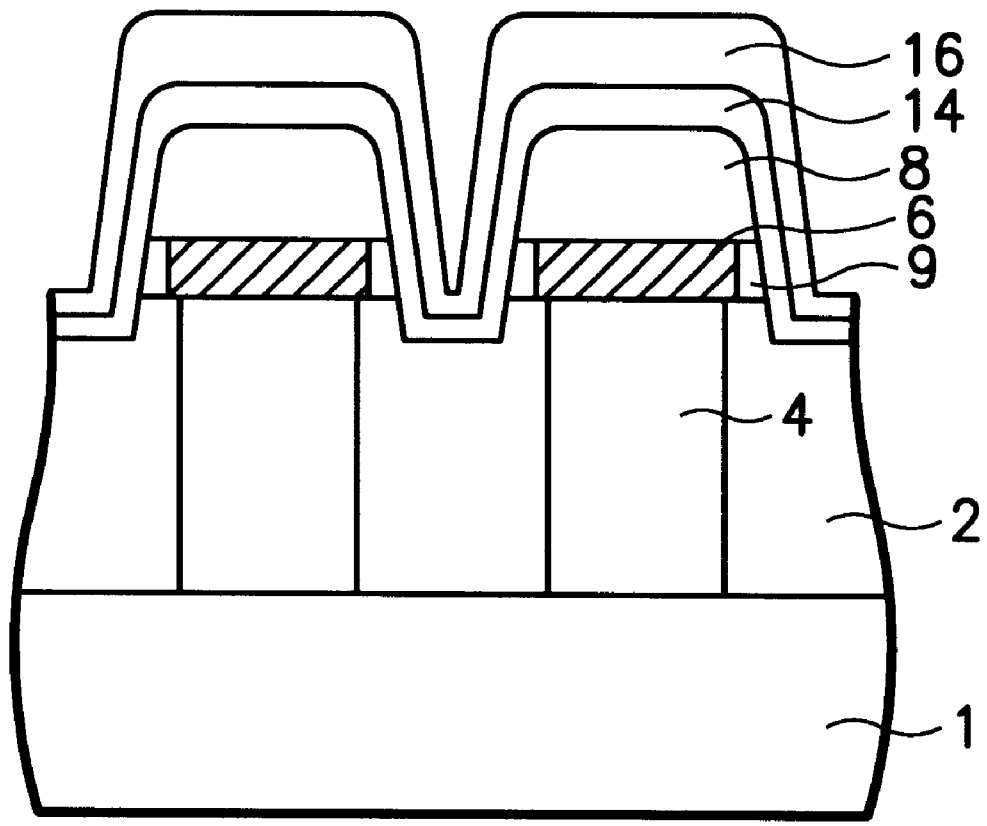
FIG. 1 is a cross-sectional view of an integrated circuit capacitor according to the prior art.
Figure 2A:
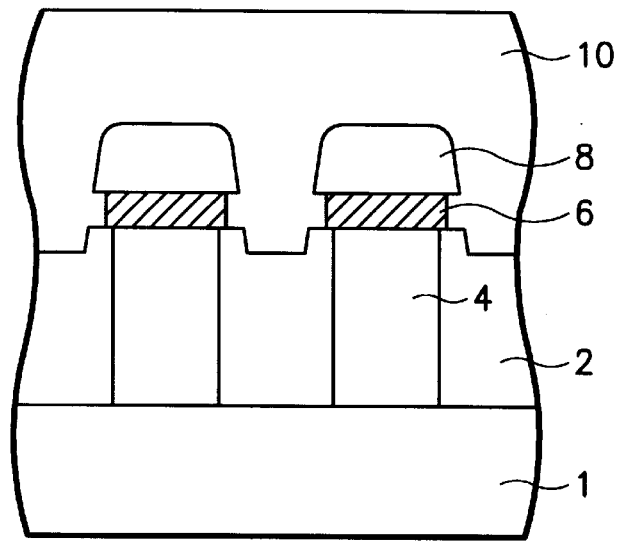
FIGS. 2A–2B are cross-sectional views of intermediate structures which illustrate a method of forming an integrated circuit capacitor according to the prior art.
Figure 2B:
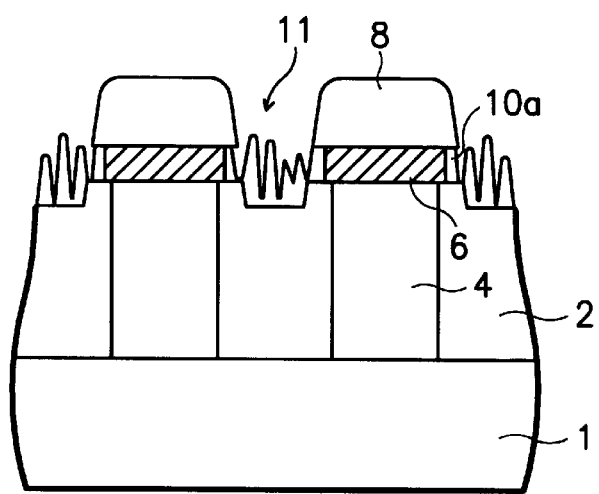
Figure 3A:
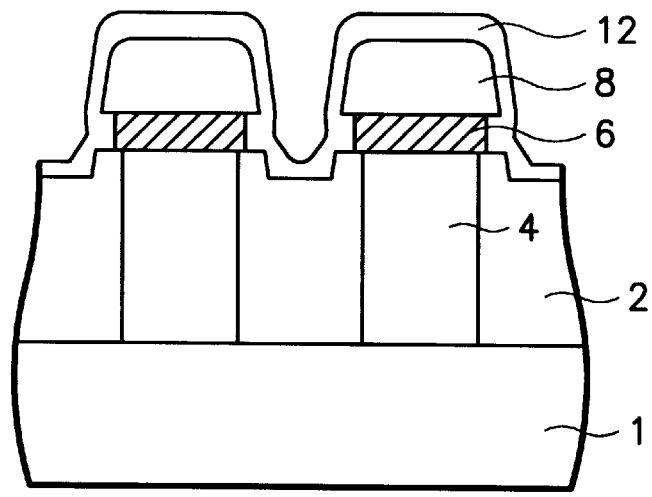
FIGS. 3A–3B are cross-sectional views of intermediate structures which illustrate a method of forming an integrated circuit capacitor according to the prior art.
Figure 3B:
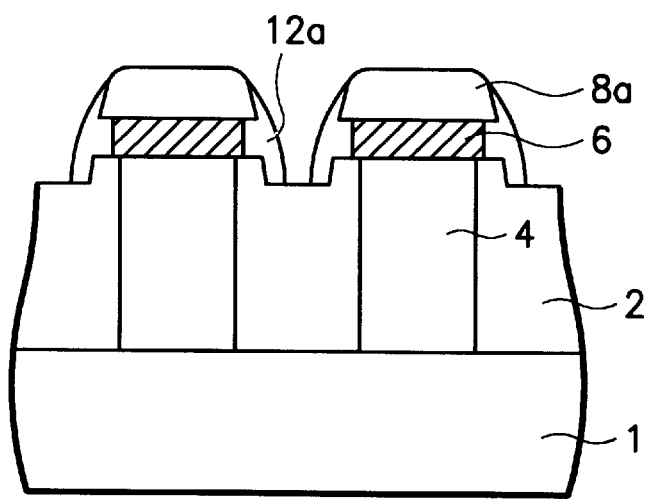
Figure 4:
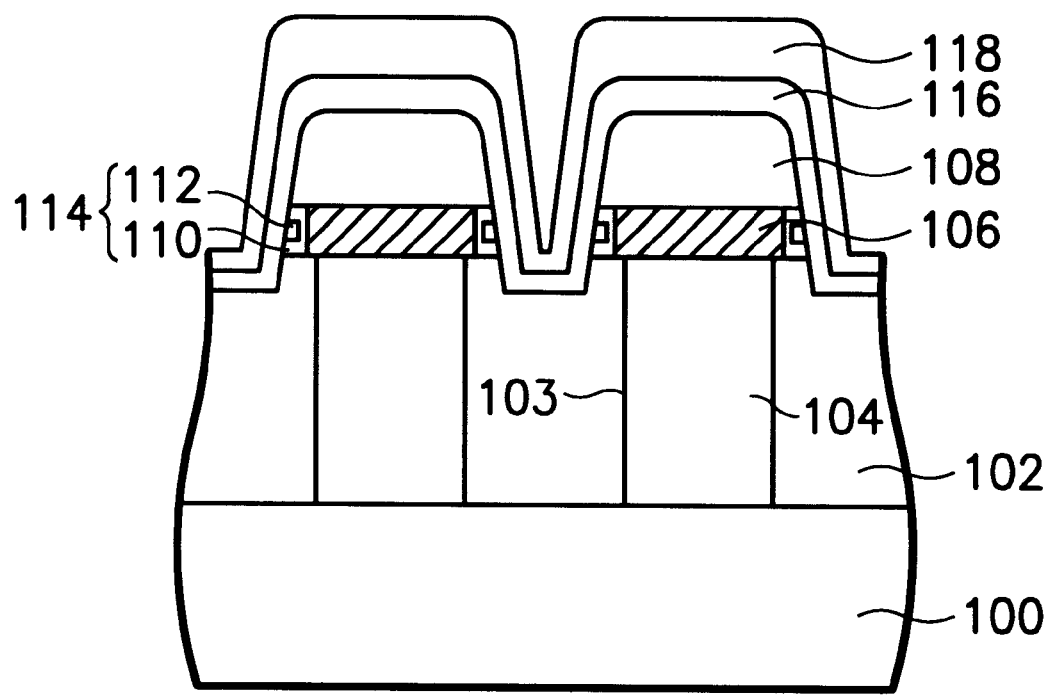
FIG. 4 is a cross-sectional view of an integrated circuit capacitor according to an embodiment of the present invention.

Referring now to FIG. 4, preferred integrated circuit capacitors according to an embodiment of the present invention comprise a semiconductor substrate 100 having a first interlayer insulating layer 102 thereon. A plurality of contact holes or vias 103 are also formed in the first interlayer insulating layer 102, as illustrated. These contact holes may be filled by conductive plugs 104 which may comprise polycrystalline silicon. The conductive plugs may form ohmic contacts with well regions (not shown) or source and drain regions (not shown) in the semiconductor substrate 100, for example. Each capacitor also comprises a first capacitor electrode 108, a second capacitor electrode 118 and a dielectric layer 116 extending between the first and second capacitor electrodes, as illustrated. The dielectric layer 116 may comprise a high dielectric material such as BST, PZT, PLZT and perovskite-type oxides. The first and second capacitor electrodes 108 may also comprise a material selected from the group consisting of Pt, Ru, $RuO_2$, Ir, $IrO_2$ and perovskite-type conductive materials.

To inhibit oxidation of the conductive plug 104 and inhibit chemical reaction between the conductive plug 104 and the first capacitor electrode 108, among other things, a diffusion barrier layer 106 is provided between the first capacitor electrode 108 and the conductive plug 104. Here, the diffusion barrier layer 106 may comprise a nitride selected from the group consisting of TiN, TiAlN, TiSiN, TaSiN, TaAlN, WN and silicides thereof, as described in commonly assigned U.S. application Ser. No. 08/969,395, entitled "Methods of Forming Integrated Circuit Capacitors Having Protected Diffusion Barrier Metal Layers Therein", filed Nov. 13, 1997, now U.S. Pat. No. 5,877,062, the disclosure of which is hereby incorporated herein by reference. As illustrated, the diffusion barrier layer 106 contacts an underlying surface of the first capacitor electrode 108 and has a sidewall which is recessed relative to a sidewall of the first capacitor electrode 108. Each integrated circuit capacitor also utilizes preferred sidewall spacers 114 to protect the diffusion barrier layer 106.

In particular, to inhibit parasitic oxidation of the diffusion barrier layer 106 during processing, preferred sidewall spacers 114 are provided on the recessed sidewall of the diffusion barrier layer 106. These sidewall spacers 114 preferably comprise a composite of a material which can be deposited at low temperatures and with good step coverage, and another material such as high density silicon dioxide and silicon nitride which can be formed at high temperature or flowable oxide (FOX) and spin-on-glass (SOG) which can be formed at low temperature. In particular, each sidewall spacer 114 preferably comprises a composite of a first spacer region 112 having a sidewall which is substantially coplanar with a sidewall of the first capacitor electrode and a second spacer region 110 which extends between the first spacer region 112 and the recessed sidewall of the diffusion barrier layer 106. The second spacer region 110 also contacts the underlying surface of the first capacitor electrode 108.

The first spacer region 112 may comprise a material such as silicon dioxide or silicon nitride which can be conformally deposited at a relatively high temperature. Alternatively, the first spacer region 112 may comprise a material such as spin-on-glass (SOG) or flowable oxide (FOX) which can be conformally deposited at a low temperature. The second spacer region 110 preferably comprises a material such as $Al_2O_3$ or $Ta_2O_5$ which can be deposited at low temperatures and has good step coverage. It is also important that the second spacer region 110 comprise a material which protects the diffusion barrier layer 106 from oxidation. The second spacer region 110 is also preferably formed to a thickness in a range between about 10 Å and 500 Å.

Referring now to FIGS. 5A–5D, preferred methods of forming the integrated circuit capacitor of FIG. 4 include the steps of forming a first interlayer insulating layer 102 on a face of a semiconductor substrate 100 and then forming contact holes 103 in the first interlayer insulating layer 102, using a photolithographically defined etching step, for example. A first layer of conductive material such as polycrystalline silicon is then deposited on the first interlayer insulating layer 102 and in the contact holes 103. This first layer of conductive material may then be planarized to expose an upper surface of the first interlayer insulating layer 102 and define a plurality of conductive plugs 104 in the first interlayer insulating layer 102. Next, a second layer of an electrically conductive material such as TiN, TiAlN, TiSiN, TaSiN, TaAlN, WN and silicides thereof is deposited on the planarized surface of the first interlayer insulating layer 102. A third layer of an electrically conductive material such as Pt, Ru, $RuO_2$, Ir, $IrO_2$ and perovskite-type conductive materials, is then deposited on the second layer. These second and third layers are then patterned using conventional photolithographically defined etching steps to define a plurality of diffusion barrier layers 106 and a plurality of first capacitor electrodes 108.

A selective etching step is then performed with an etchant that etches the material of the diffusion barrier layers 106 at a faster rate than the material of the first capacitor electrodes 108. The selected etchant may also etch the material of the first interlayer insulating layer 102. This selective etching step causes the sidewalls of each diffusion barrier layer 106 to become recessed relative to the sidewalls of a respective first capacitor electrode 108.

A relatively thin oxidation barrier layer 110 of an electrically insulating material such as $Al_2O_3$ or $Ta_2O_5$ is then conformally deposited at a low temperature on the first capacitor electrodes 108, the recessed sidewalls of the diffusion barrier layers 106 and the first interlayer insulating layer 102, as illustrated. This relatively thin layer 110 is preferably formed to have a thickness in a range between about 10 Å and 500 Å. This layer 110 should be formed of a material which has excellent oxidation resistant characteristics, so that during subsequent processing the recessed sidewalls of the diffusion barrier layers 106 do not become oxidized. The layer 110 should also be formed of a material having good step coverage characteristics. As illustrated by the highlighted region 107, the layer 110 preferably extends into the recess, along an underlying surface of the first capacitor electrode 108 and along the recessed sidewall of the diffusion barrier layer 106.

Figure 5A:
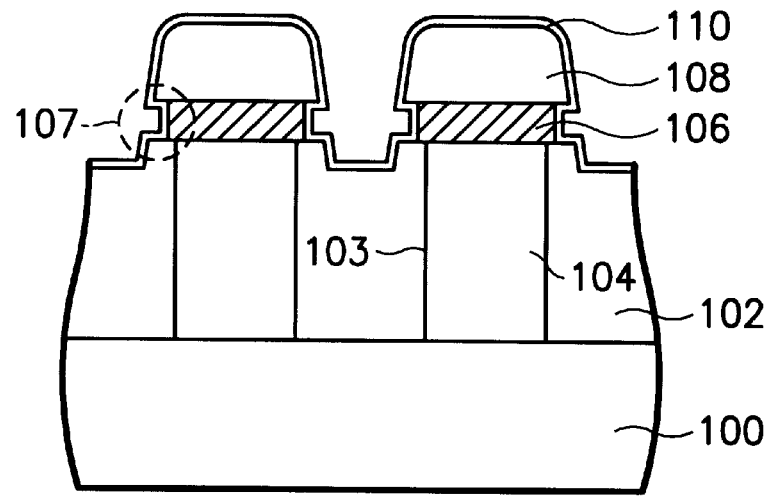
FIGS. 5A–5D are cross-sectional views of intermediate structures which illustrate methods of forming the integrated circuit capacitor of FIG. 4.
Figure 5B:
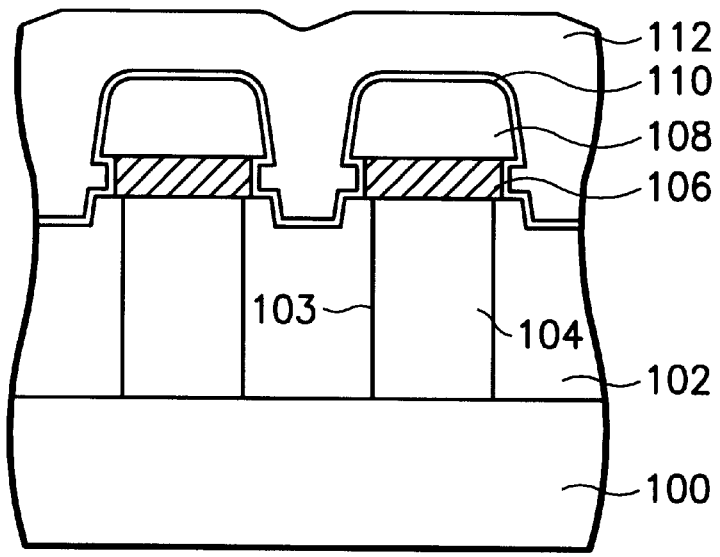

Referring now to FIG. 5B, a relatively thick oxidation barrier layer 112 (e.g., 4000 Å) is then deposited on the structure of FIG. 5A. This layer 112 is made sufficiently thick to fill up the remaining portion of the recesses defined between the sidewalls of the first capacitor electrode 108 and the diffusion barrier layer 106. This relatively thick oxidation barrier layer 112 is preferably formed of a material which can be selectively etched relative to the thin oxidation barrier layer 110. For example, the relatively thick oxidation barrier layer 112 may be formed as a spin-on-glass (SOG) layer or a flowable oxide (FOX) layer at a low temperature. Alternatively, the relatively thick oxidation barrier layer 112 may be formed at a relatively high temperature (to improve step coverage) with a material such as silicon nitride (SiN) or high density silicon dioxide (HD-$SiO_2$). This barrier layer may also comprise a conductive material (e.g., metal), but such use is less preferred.

Figure 5C:
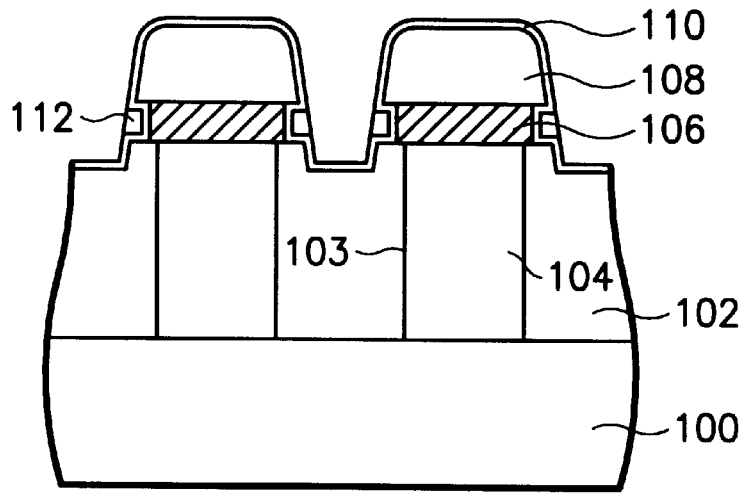
Figure 5D:
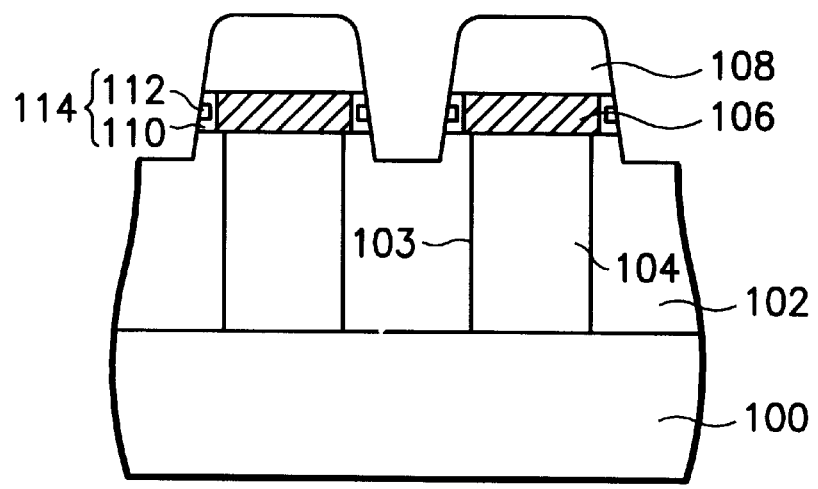

Referring now to FIG. 5C, a selective etching step is performed to etch-back the relatively thick oxidation barrier layer 112, using the relatively thin oxidation barrier layer 110 as an etch-stop layer. Then, as illustrated by FIG. 5D, another selective etching step is performed to etch-back the relatively thin oxidation barrier layer 110 until the first capacitor electrode 108 is exposed. Here, the portion of the relatively thick oxidation barrier layer 112 which remains in the recessed region (region 107 in FIG. 5A) acts to prevent the removal of the second spacer region 110. Accordingly, by using a relatively thin oxidation barrier layer 110 in combination with a relatively thick oxidation barrier layer 112, it is unnecessary to form a sidewall spacer comprising only $Al_2O_3$ as an oxidation barrier material. This means the likelihood that the first capacitor electrode 108 will be overetched and reduced in size during processing can be avoided. Referring again to FIG. 4, conventional steps are then performed to define a dielectric layer 116 and a second capacitor electrode 118.

In the drawings and specification, there have been disclosed typical preferred embodiments of the invention and, although specific terms are employed, they are used in a generic and descriptive sense only and not for purposes of limitation, the scope of the invention being set forth in the following claims.

That which is claimed is:

1. An integrated circuit capacitor, comprising:

a substrate;

a first capacitor electrode on said substrate;

a diffusion barrier layer between said first capacitor electrode and said substrate, said diffusion barrier layer extending adjacent an underlying surface of said first capacitor electrode and having a sidewall which is recessed relative to a sidewall of said first capacitor electrode; and an electrically insulating spacer on the recessed sidewall of said diffusion barrier layer, said electrically insulating spacer comprising a composite of a first spacer region comprising a first material having a sidewall which is substantially coplanar with the sidewall of said first capacitor electrode and a second spacer region comprising a second material which extends between the first spacer region and the recessed sidewall of said diffusion barrier layer and contacts the underlying surface of said first capacitor electrode.

2. The capacitor of claim 1, wherein the second spacer region has a thickness in a range between about 10 Å and 500 Å.

3. The capacitor of claim 1, wherein the second spacer region comprises material selected from the group consisting of $Al_2O_3$ and $Ta_2O_5$.

4. The capacitor of claim 2, wherein the second spacer region comprises material selected from the group consisting of $Al_2O_3$ and $Ta_2O_5$.

5. The capacitor of claim 4, wherein the first spacer region comprises material selected from the group consisting of silicon dioxide, silicon nitride and spin-on-glass.

6. The capacitor of claim 5, further comprising:

a dielectric layer extending on an upper surface and on the sidewall of said first capacitor electrode; and a second capacitor electrode on the dielectric layer.

7. The capacitor of claim 1, further comprising:

a dielectric layer extending on an upper surface and on the sidewall of said first capacitor electrode; and a second capacitor electrode on the dielectric layer.

8. The capacitor of claim 7, wherein said dielectric layer comprises a material selected from the group consisting of BST, PZT, PLZT and perovskite-type oxides.

9. The capacitor of claim 8, wherein said second capacitor electrode comprises a material selected from the group consisting of Pt, Ru, $RuO_2$, Ir, $IrO_2$ and perovskite-type conductive materials.

10. The capacitor of claim 6, wherein said dielectric layer comprises a material selected from the group consisting of BST, PZT, PLZT and perovskite-type oxides.

11. The capacitor of claim 10, wherein said second capacitor electrode comprises a material selected from the group consisting of Pt, Ru, $RuO_2$, Ir, $IrO_2$ and perovskite-type conductive materials.

12. The capacitor of claim 10, further comprising:

a first interlayer insulating layer having a contact hole therein, on said substrate; and a conductive plug in the contact hole, said conductive plug electrically contacting said substrate and said diffusion barrier layer.

* * * * *